(12) United States Patent
Okanobu

(10) Patent No.: US 6,392,454 B1
(45) Date of Patent: May 21, 2002

(54) SHUNT REGULATED PUSH-PULL CIRCUIT HAVING WIDE FREQUENCY RANGE

(75) Inventor: Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/317,832

(22) Filed: May 25, 1999

(30) Foreign Application Priority Data

Jun. 1, 1998 (JP) .......................................... 10-150884

(51) Int. Cl.$^7$ ................................................. H03K 3/00
(52) U.S. Cl. ........................ 327/112; 327/478; 327/552
(58) Field of Search ................................ 327/108, 111, 327/112, 419, 432, 478, 484, 492, 551, 552, 558

(56) References Cited

U.S. PATENT DOCUMENTS

| 3,892,983 A | * | 7/1975 | Okada et al. | ............... 327/487 |
| 4,017,788 A | | 4/1977 | Stepp et al. | .................. 323/8 |
| 4,879,506 A | | 11/1989 | Braun | ......................... 323/314 |
| 5,539,350 A | * | 7/1996 | Wilhelm | ..................... 327/375 |
| 5,952,736 A | * | 9/1999 | Matsubara | .................. 307/106 |

FOREIGN PATENT DOCUMENTS

JP          8228136         9/1996     .......... H03K/17/14

* cited by examiner

Primary Examiner—Tuan T. Lam
(74) Attorney, Agent, or Firm—Jay H. Maioli

(57) ABSTRACT

In an SRPP circuit, a transistor Q11 has a collector connected to a power supply terminal T13 through a resistor R11 and an emitter connected to the collector of a transistor Q12 having the same polarity as that of transistor Q11. The emitter of the transistor Q12 is connected to the ground. The collector of the transistor Q11 is connected to the emitter of a transistor Q13 having the polarity opposite to that of the transistor Q11, and the collector of the transistor Q13 is connected to the base of the transistor Q12. A bias voltage V13 is applied to the base of the transistor Q13. An input signal Vin is supplied to the base of the transistor Q11 to extract an output signal from a node between the emitter of the transistor Q11 and the collector of the transistor Q12.

8 Claims, 5 Drawing Sheets

SHUNT REGULATED PUSH-PULL CIRCUIT HAVING WIDE FREQUENCY RANGE

BACKGROUND OF THE INVENTION

1. Field of the Invention

The present invention relates to an SRPP circuit (shunt regulated push pull).

2. Description of the Related Art

FIG. 1 shows a case in which a sixth order low-pass filter is formed of an active filter. Amplifiers A1 to A3 as used are generally formed of voltage followers. The voltage followers A1 to A3 (amplifiers A1 to A3) may be formed of (1) emitter followers, (2) SRPP circuits, (3) operational amplifiers, or the like.

Incidentally, the emitter follower of (1) may be structured, for example, as shown in FIG. 2. That is, the transistor Q1 has its emitter connected with a constant-current power transistor Q2 to form an emitter follower, its base supplied with an input signal voltage Vin and a base bias voltage VBB and its collector supplied with a supply voltage VCC. In this way, an output voltage or an output current is extracted from the emitter of transistor Q1.

In case of the emitter follower, assuming that the value of the collector current of the transistor Q2 is IC2, as indicated by a solid line in FIG. 3, the emitter current IE1 of the transistor Q1 varies in proportion with a signal voltage Vin with the value IC2 as a center. Thus, the amount of variation is extracted as an output.

Hence, as indicated by a broken line in FIG. 3, an output current as large as desired can be extracted within a range in which the characteristic of the transistor Q1 is permitted during a positive half cycle period. However, during a negative half cycle period, an output current larger than the IC2 cannot be extracted.

The SRPP circuit of (2) can be structured as shown in FIG. 4. In the SRPP circuit, a signal voltage opposite in phase to the input signal voltage Vin is outputted to the collector of the transistor Q1, and the signal voltage is supplied to the base of a transistor Q2 through a capacitor C1. Accordingly, since the transistors Q1 and Q2 are driven with phases opposite to each other, the emitter current of the transistor Q1 and the collector current of the transistor Q2 vary in directions opposite to each other, and the amount of its difference is extracted as the output current. Accordingly, the SRPP circuit can extract the large output current even during the negative half cycle period.

However, in case of the SRPP circuit, since the base input of the transistor Q2 is supplied from the collector of the transistor Q1 through the capacitor C1 for d.c. cutting, it is necessary to increase the value of the capacitor C1 in order to extract the large output even in a low frequency.

Accordingly, the SRPP circuit is not proper for implementation as an IC.

From the above viewpoint, the SRPP circuit shown in FIG. 5 has been proposed. That is, in the SRPP circuit, the collector output of the transistor Q1 is extracted through the transistor Q3 that constitutes the emitter follower, and a d.c. voltage is shifted by a constant voltage diode D1 before being supplied to the base of the transistor Q2.

Accordingly, in case of this SRPP circuit, since there is provided no element for limiting the frequency characteristic as in the capacitor C1, the frequency characteristic is excellent and a large output can be extracted even in the low frequency.

However, in case of this SRPP circuit, since the d.c. operating point of the circuit is set in accordance with the constant-voltage characteristic of the constant-voltage diode D1, if the supply voltage VCC varies, the operating current of the transistors Q1 to Q3 largely varies, thereby disenabling the satisfactory characteristic to be obtained. In particular, when the supply voltage VCC is low, such a tendency is high.

In addition, if the operational amplifier is used for the voltage follower, the number of operational amplifiers increases more as the degree is high, thereby making the circuit scale remarkably large. Also, if an amplifier for wide-band frequencies is used in correspondence with applied frequencies, current consumption is caused to increase.

SUMMARY OF THE INVENTION

The present invention has been made to solve the above problems with the conventional circuit.

To achieve the above object, according to the present invention, there is provided an SRPP circuit comprising:

a first transistor;

a resistor through which the collector of the first transistor is connected to a first reference potential point;

a second transistor having the same polarity as that of the first transistor, the collector of the second transistor being connected to the emitter of the first transistor, the emitter of the second transistor being connected to a second reference potential point; and a third transistor having the polarity opposite to that of the first transistor, the emitter of the third transistor being connected to the collector of the first transistor and the collector of the third transistor being connected to the base of the second transistor, a bias voltage being supplied to the base of the third transistor;

wherein an input signal is supplied to the base of the first transistor, and an output signal is extracted from a node of the emitter of the first transistor and the collector of the second transistor.

Accordingly, since the third transistor operates with its base being grounded to supply the collector output of the first transistor to the base of the second transistor, the above circuit structure operates as an SRPP circuit.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

Figure 6:
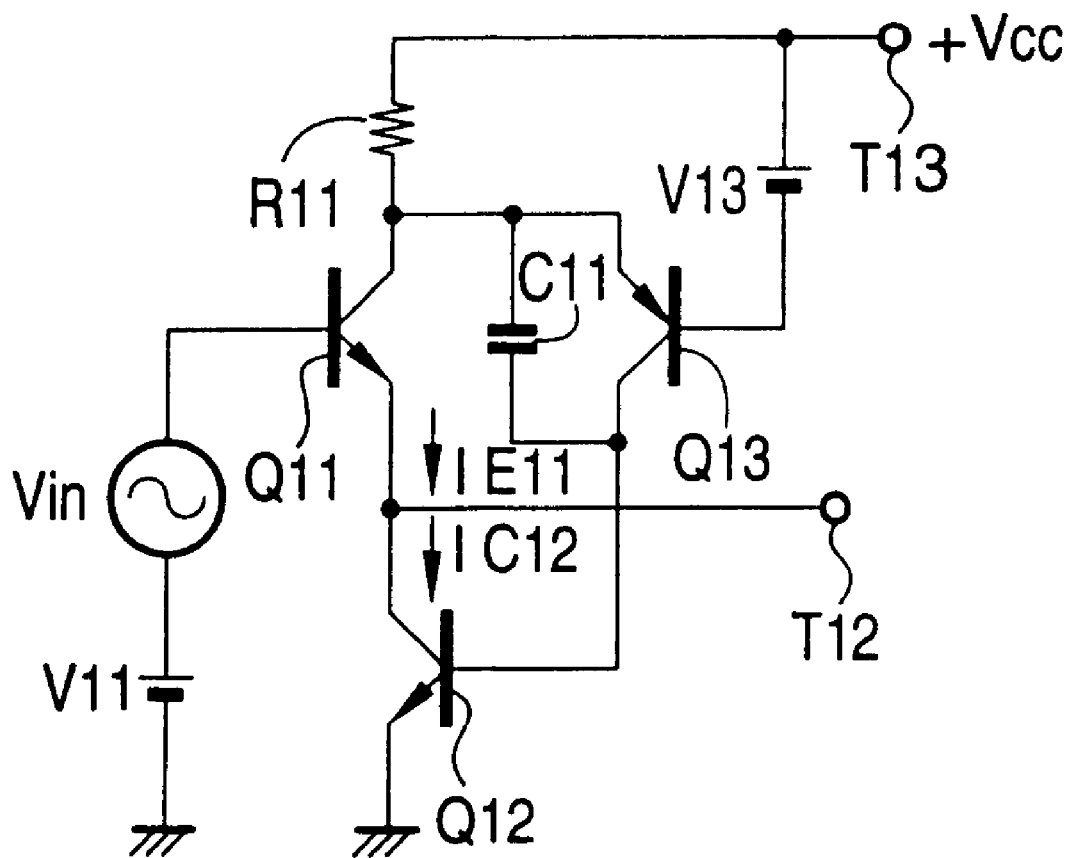
FIG. 6 is a circuit diagram showing an SRPP circuit according to an embodiment of the present invention.

Referring to FIG. 6, a transistor Q11 has a base to which an input signal voltage Vin and a base bias voltage V11 are applied, and a collector connected to a first reference potential point, for example, a power supply terminal T13 through a resistor R11. The transistor Q11 also has an emitter connected to the collector of a transistor Q12 having the same polarity as that of the transistor Q11, and the emitter of the transistor Q12 is connected to a second reference potential point, for example, the ground. In addition, the collector of the transistor Q11 is connected to the emitter of a transistor Q13 having the polarity opposite to that of the transistor Q11, and the collector of the transistor Q13 is connected to the base of the transistor Q12.

Also, the emitter of the transistor Q11 is connected to an output terminal T12, a capacitor C11 is connected between the emitter and collector of the transistor Q13, and a bias voltage V13 with the power supply terminal T13 as a reference potential point is applied to the base of the transistor Q13.

In the circuit thus structured, for example, when the input signal voltage Vin increases, the emitter current IE11 of the transistor Q11 increases, and in this situation, the collector current of the transistor Q11 also increases to lower the collector potential thereof. As a result, since the emitter current of the transistor Q13 reduces, the collector current thereof also reduces, and the collector current IC12 of the transistor Q12 also reduces. Therefore, a current which is a difference between an increased amount of the emitter current IE11 and a decreased amount of the collector current IC12 flows out to the terminal T12.

On the other hands, when the input signal voltage Vin decreases, the emitter current IE11 of the transistor Q11 decreases. However, in this situation, the collector current of the transistor Q11 also decreases to increase the collector potential thereof. As a result, since the emitter current of the transistor Q13 increases, the collector current thereof also increases, and the collector current IC12 of the transistor Q12 also increase. Therefore, a current which is a difference between a decreased amount of the emitter current IE11 and an increased amount of the collector current IC12 flows out to the terminal T12.

In other words, in the circuit of FIG. 6, the transistor Q13 operates with the base thereof being grounded in response to the collector output of the transistor Q11, and the collector output is supplied to the base of the transistor Q12 in the same phase. In this situation, the input signal voltage Vin is opposite in phase to the collector output of the transistor Q11. Accordingly, the transistors Q11 and Q12 are driven with the phases opposite to each other with respect to the signal voltage Vin, to thereby execute the SRPP operation.

Figure 1:
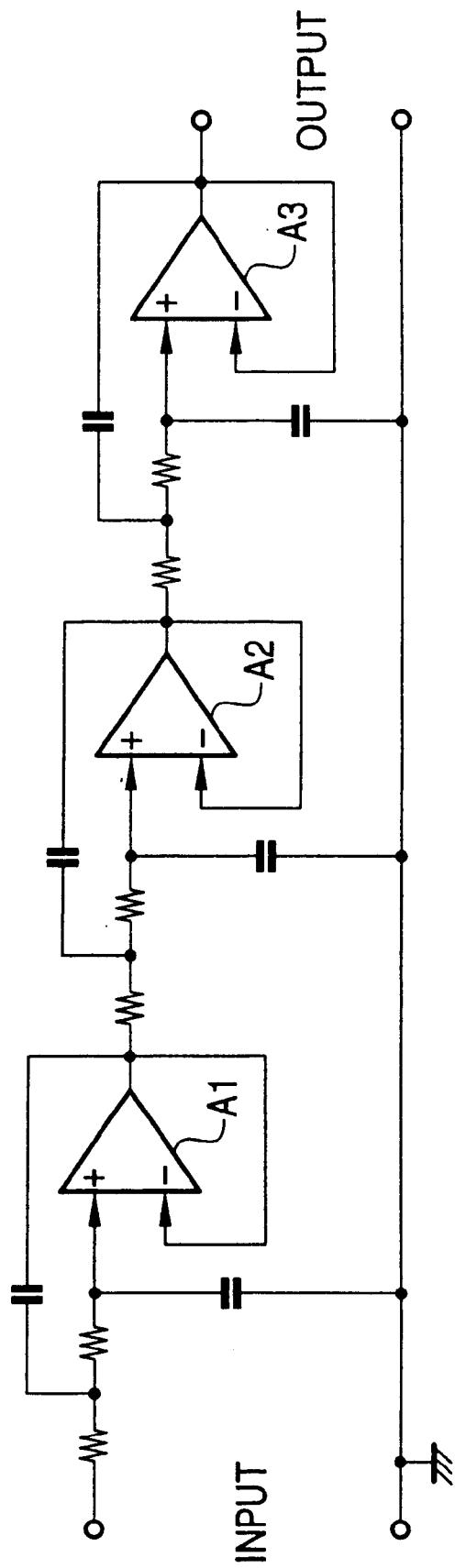
FIG. 1 is a circuit diagram showing an example of a filter to which the present invention is applied.
Figure 2:
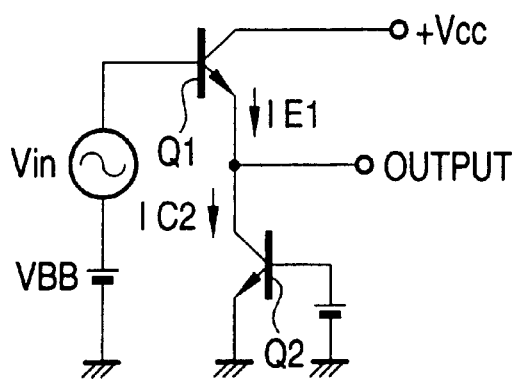
FIG. 2 is a circuit diagram for explanation of a known SRPP circuit.
Figure 3:
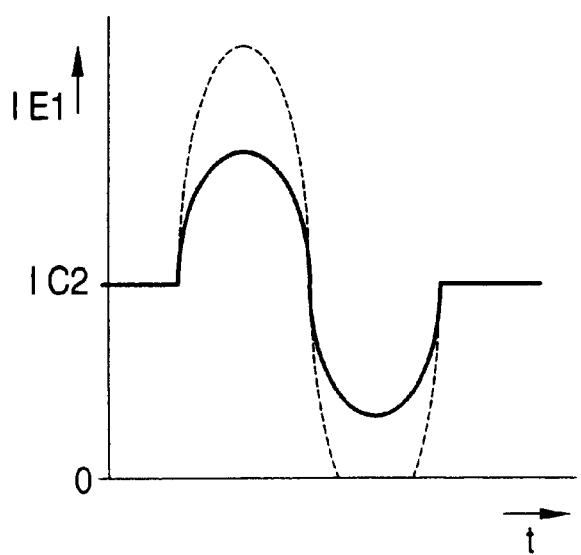
FIG. 3 is a waveform diagram for explanation of the circuit of FIG. 2.
Figure 4:
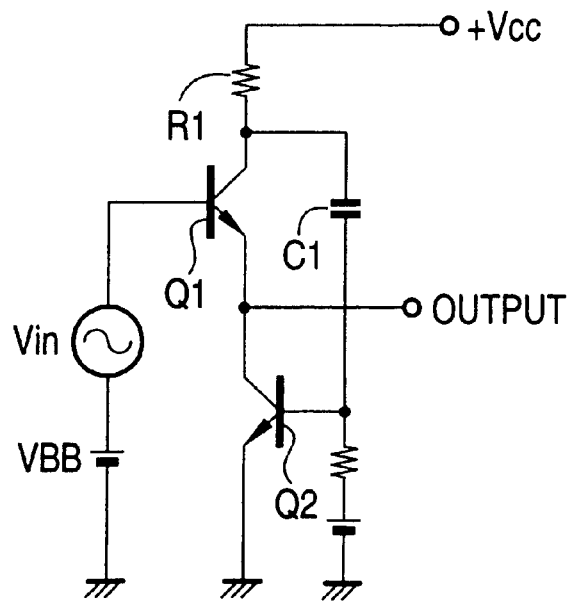
FIG. 4 is a circuit diagram for explanation of a known SRPP circuit.
Figure 5:
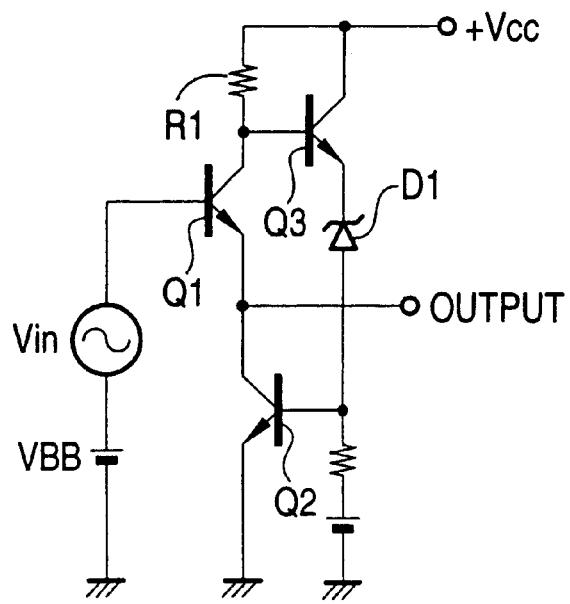
FIG. 5 is a circuit diagram for explanation of the SRPP circuit according to the present invention.

With the above structure, a large output can be obtained from the terminal T12 within a range in which the output is permitted by the characteristics of the transistors Q11 and Q12, and in this situation, there is no case in which the output current during one half cycle is limited as shown in FIG. 3.

Also, since the transistor Q13 operates with its base being grounded, the frequency characteristic is excellent, and a large output can be obtained from d.c. even in a high frequency. In particular, when the capacitor C11 is connected to the transistor Q13, since the deterioration of the characteristics of the transistor Q13 in a higher frequency can be compensated, a large output can be obtained up to a higher frequency. In this example, since the capacitor C11 is provided for compensation in the high frequency, its value may be set at about 1 to 3 pF, and the entire circuit can be put into an IC without problems.

In addition, even if the supply voltage Vcc of the terminal T13 varies, such variation is absorbed by changing a voltage between the collector and the emitter of the transistor Q13, the circuit is applicable in a range of a wide supply voltage VCC. Also, since the number of elements as required is small, even in the case where the circuit is applied to a high-order active filter, the circuit scale is not increased. Further, since the frequency characteristic is excellent as described above, the circuit is also applicable to an active filter adapted to a high frequency without problems.

In addition, since the output impedance is low and a change in the output impedance due to the signal frequency is small, the circuit is suitable as the voltage follower in the active filter.

Figure 7:
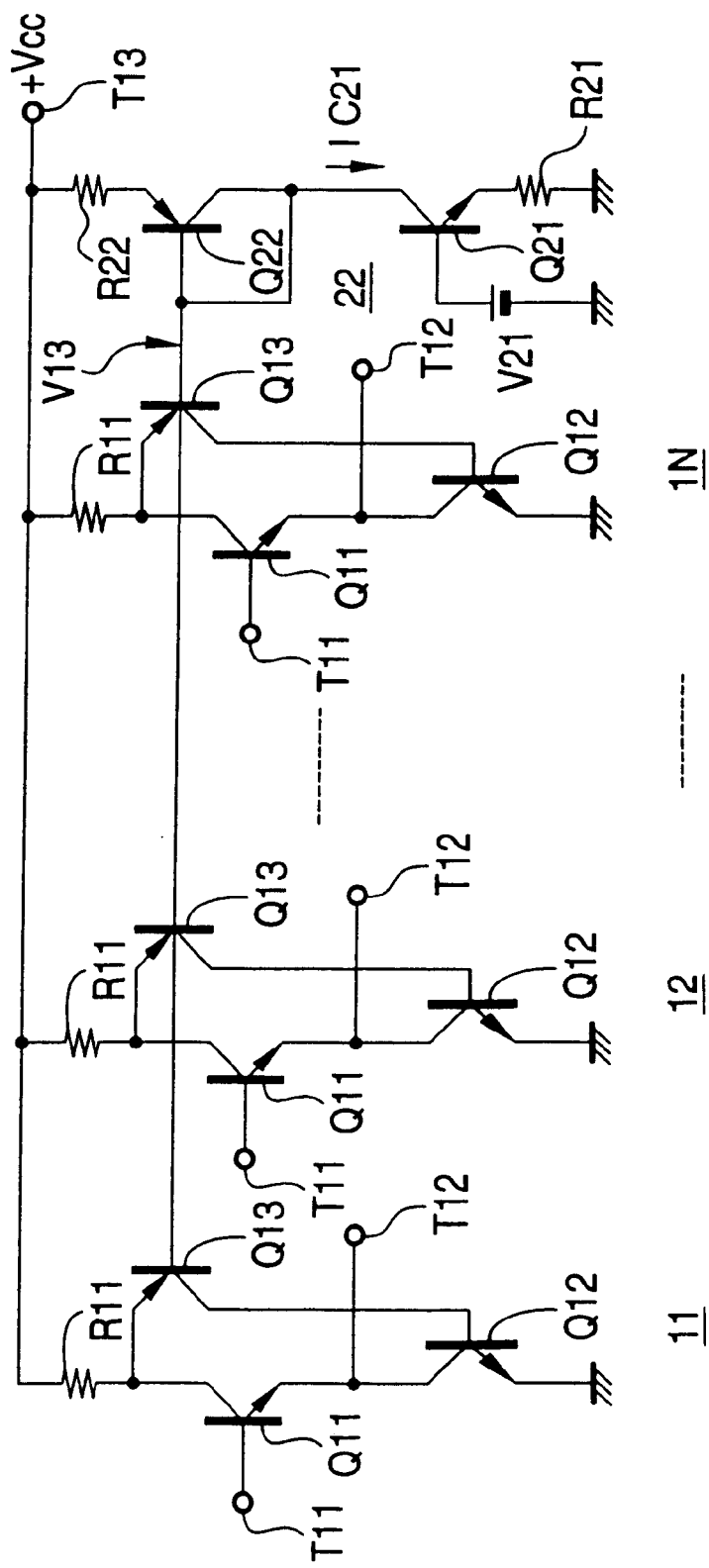
FIG. 7 is a circuit diagram showing an SRPP circuit according to another embodiment of the present invention.

FIG. 7 shows an embodiment of a bias circuit designed in such a manner that a bias voltage V13 can be applied to the above-described N SRPP circuits such as shown in FIG. 6, in which reference symbols 11 to 1N denote the successive SRPP circuits described above. It should be noted that those SRPP circuits 11 to 1N are not connected to the capacitor C11 for improvement of a high-frequency characteristic for simplification of the figure, but the former may be connected to the latter.

A transistor Q21 has a base to which a given bias voltage V21 is applied, an emitter grounded through a resistor R21 and a collector connected to the collector and the base of the transistor Q22. The transistor Q22 structures a current mirror circuit 22 in which the transistor Q21 is disposed at an input side and the transistors Q13 to Q13 of the SRPP circuits 11 to 1N are disposed at an output side. In the circuit, the base of the transistor Q22 is connected to the bases of the transistors Q13 to Q13, and the emitter of the transistor Q22 is connected to the power supply terminal T13 through a resistor R22.

In the above structure, the collector current IC21 of the transistor Q22 is represented by:

$$IC21=(V21-VBE)/R21$$

where VBE is a voltage between the base and the emitter of the transistor Q21.

Also, since the collector current of the transistor Q22 is approximately equal to the collector current IC21 of the transistor Q21, the base current IB22 of the transistor Q22 is represented by:

$$IB22 \approx IC21/hFE$$

where hFE is a current amplification factor of the transistor Q22. The base voltage that supplies the base current IB22 to the transistor Q22 is also applied to the bases of the transistors Q13 to Q13. Accordingly, the bias voltage V13 is applied to the transistors Q13 to Q13.

In the bias circuit thus structured, the bias voltage V13 can be applied to N SRPP circuits 11 to 1N with an extremely simple structure as is apparent from the drawing. Also, since the transistors Q13 to Q13 operate with their bases being grounded and the base currents of the transistors Q13 to Q13 are extremely small, even if the bias voltage V13 is applied commonly to the bases of the transistors Q13 to Q13, an interference between the SRPP circuits 11 to 1N can be sufficiently reduced.

According to the present invention, as described above, a large output can be obtained within a range in which the output is permitted by the characteristics of the transistors Q11 and Q12, and in this situation, there is no case in which the output current during one half cycle is limited.

Also, the frequency characteristic is excellent, and a large output can be obtained from d.c. even in a high frequency. In addition, with the connection of the capacitor C11, a large output can be obtained up to a higher frequency. Then, since the capacitor C11 is provided for compensation in a high frequency in this case, the value of the capacitor C11 may be small, and even if the capacitor C11 is connected in the circuit, the entire circuit can be put into an IC without problems.

Further, the circuit can be used within a range of a wide supply voltage. Also, since the number of elements as required is small, even in the case where the circuit is used in a high-order active filter, the circuit scale does not become larger. In addition, since the output impedance is low and a change in the output impedance due to the signal frequency is small, the circuit is suitable, for example, as the voltage follower in the active filter.

Still further, the bias circuit can be structured very simply. Also, even when the bias voltage is applied commonly to a plurality of SRPP circuits, an interference between the respective SRPP circuits can be sufficiently reduced.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A shunt regulated push-pull circuit comprising:
   a first transistor;
   a resistor through which a collector of said first transistor is connected to a first reference potential;
   a second transistor having a same polarity as said first transistor, a collector of said second transistor being connected to an emitter of said first transistor, and an emitter of said second transistor being connected to a second reference potential; and
   a third transistor having a polarity opposite a polarity of said first transistor, an emitter of said third transistor being connected to the collector of said first transistor and a collector of said third transistor being connected to a base of said second transistor, and a bias voltage being supplied to a base of said third transistor;
   wherein an input signal is supplied to a base of said first transistor, and an output signal is extracted from a node of the emitter of said first transistor and the collector of said second transistor.

2. The shunt regulated push-pull circuit as claimed in claim 1, further comprising a capacitor connected in parallel between the emitter and the collector of said third transistor.

3. The shunt regulated push-pull circuit as claimed in claim 2, wherein the entire shunt regulated push-pull circuit is manufactured as a one-chip integrated circuit.

4. The shunt regulated push-pull circuit as claimed in claim 1, wherein said bias voltage is applied from a bias circuit that absorbs a change in the characteristics of elements forming the shut regulated push-pull circuit.

5. The shut regulated push-pull circuit as claimed in claim 4, wherein said bias circuit is formed of a current mirror circuit.

6. The shunt regulated push-pull circuit as claimed in claim 4, wherein the entire shunt regulated push-pull circuit is manufactured as a one-chip integrated circuit.

7. The shunt regulated push-pull circuit as claimed in claim 5, wherein the entire shunt regulated push-pull circuit is formed as a one-chip integrated circuit.

8. The shunt regulated push-pull circuit as claimed in claim 1, wherein a capacitor is connected in parallel between the emitter and the collector of said third transistor;
   said bias voltage is applied from a bias circuit formed of a current mirror circuit; and
   the entire circuit is manufactured as into a one-chip integrated circuit.

* * * * *